US006906268B2

(12) United States Patent
Fartash et al.

(10) Patent No.: US 6,906,268 B2
(45) Date of Patent: Jun. 14, 2005

(54) HEAT-SHRINKABLE RETAINER FOR PCB DOUBLE-SIDED ASSEMBLY

(75) Inventors: Arjang Fartash, Corvallis, OR (US); Christopher D. Combs, Portland, OR (US); Raiyomand Aspandiar, Portland, OR (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 10/022,821

(22) Filed: Dec. 14, 2001

(65) Prior Publication Data

US 2003/0111260 A1 Jun. 19, 2003

(51) Int. Cl.[7] ................................................ H05K 1/00
(52) U.S. Cl. ...................... 174/250; 174/251; 174/255; 439/82
(58) Field of Search ............................... 174/250, 255, 174/260, 52.1, 251, 261; 361/760, 807, 810; 439/69–75, 78–84

(56) References Cited

U.S. PATENT DOCUMENTS

| | | | | |
|---|---|---|---|---|
| 4,686,499 A | * | 8/1987 | Furnish | 333/230 |
| 4,894,030 A | * | 1/1990 | Chavaroux | 439/874 |
| 5,137,478 A | * | 8/1992 | Graf et al. | 439/874 |
| 5,192,837 A | * | 3/1993 | Chardon | 200/61.41 |
| 5,331,513 A | * | 7/1994 | Hirai et al. | 361/760 |
| 5,547,395 A | * | 8/1996 | Delamotte | 439/578 |
| 6,231,392 B1 | * | 5/2001 | van Woensel | 439/610 |
| 6,632,023 B1 | * | 10/2003 | Ogawa et al. | 385/53 |

* cited by examiner

Primary Examiner—Kamand Cuneo
Assistant Examiner—Jeremy Norris
(74) Attorney, Agent, or Firm—Blakely, Sokoloff, Taylor & Zafman LLP (57) ABSTRACT

An apparatus to retain an assembled component on one side of a double-sided printed circuit board during reflow of other components subsequently positioned on an opposite side of the double-sided printed circuit board and methods for manufacturing and using the same. The retainer includes a heat-shrinkable member and a retaining member. Being formed from a heat-shrinkable material, the heat-shrinkable member is configured to receive a post extending through an opening formed in a double-sided printed circuit board from a component previously assembled on one side thereof. The retaining member is coupled with the heat-shrinkable member, and the double-sided printed circuit board is disposed substantially between the retaining member and the component. The heat-shrinkable member is configured to shrinkably engage the post when an opposite side of the double-sided printed circuit board is populated and reflowed, retaining the inverted component on the double-sided printed circuit board.

26 Claims, 4 Drawing Sheets

HEAT-SHRINKABLE RETAINER FOR PCB DOUBLE-SIDED ASSEMBLY

FIELD OF THE INVENTION

The present invention relates generally to printed circuit board assembly and, more particularly, to an apparatus and method to retain an assembled component on one side of a double-sided printed circuit board during reflow of other components subsequently positioned on an opposite side of the double-sided printed circuit board.

BACKGROUND OF THE INVENTION

Printed circuit boards (PCBs) generally comprise a composite of organic and inorganic materials with external and internal metal traces, permitting assembled electronic components to be mechanically supported and electrically connected. A typical printed circuit board includes one or more metal layers, such as routing and/or plane layers, and one or more insulation layers. Each of the insulation layers is disposed substantially between successive metal layers with each outer layer of the printed circuit board comprising one of the metal layers. Each of the metal routing layers is patterned to transfer signals between assembled electronic components, and each of the metal plane layers, such as a power plane layer and/or a ground plane layer, is designed to distribute power and/or ground, respectively, throughout the printed circuit board.

Electronic components are assembled on at least one of the outer metal layers of the typical printed circuit board. On a single-sided printed circuit board, for example, electronic components are assembled on only one of the outer metal layers, referred to as the primary side of the printed circuit board. The opposite side of such a printed circuit board is called the secondary side. After the electrical components have been positioned on the primary side via, for example, a pick-and-place machine (not shown), the single-sided printed circuit board typically undergoes a single soldering stage. Alternatively, electronic components can be assembled on both the primary side and the secondary side of a double-sided printed circuit board. To assemble electrical components on both sides, double-sided printed circuit boards must typically undergo multiple soldering stages.

Today, a significant number of electrical components are surface mounted to printed circuit boards. The driving force behind the use of surface-mount (SMT) components is reduced package size, improved utilization of printed circuit board real estate, and simplified assembly. Surface-mount components are positioned on metal pads or lands, which are formed on the outer metal layers of the printed circuit board, by applying solder paste to the relevant lands before positioning the surface-mount components. Comprising solder and flux, the solder paste liquefies during a manufacturing stage called solder reflow (or more simply reflow), and the surface tension of the liquefied solder enables the surface-mount components to align with, and to couple with, the relevant lands on the printed circuit board. Thus, when the solder cools and solidifies, the surface-mount components each are assembled on the printed circuit board.

To more efficiently utilize printed circuit board real estate, double-sided printed circuit boards are used with surface-mount components assembled on both the primary side and the secondary side of the printed circuit board. On a double-sided printed circuit board, surface-mount components first are assembled, i.e. positioned and reflowed, on an upward-facing side, such as the primary side, of the printed circuit board. The double-sided printed circuit board then is flipped over such that the opposite side, such as the secondary side, faces upwardly, and additional surface-mount components are positioned on the secondary side. After the additional surface-mount components have been positioned, the double-sided printed circuit board undergoes a second reflow stage to liquefy the solder on the upward-facing secondary side. During the second reflow stage, however, the entire double-sided printed circuit board is heated, and the solder on the primary side of the double-sided printed circuit board also liquefies with the surface-mount components assembled on the primary side facing downwardly in opposition of gravity.

Unlike through-hole components, most surface-mount components do not include any retaining devices, such as through-hole conductive pins and/or locating posts, to maintain component placement during the second reflow stage. Although adequate to maintain component placement on the upward-facing secondary side of the double-sided printed circuit board, the surface tension of the liquefied solder during the second reflow stage generally is insufficient to maintain component placement for heavier surface-mount components previously assembled on the downward-facing primary side. Due to the effects of gravity, one or more of the surface-mount components previously assembled on the downward-facing primary side can separate from or become substantially misaligned with the relevant lands when the solder again liquefies during the second reflow stage. For example, the inverted surface-mount components during the second reflow stage can separate from the double-sided printed circuit board and/or undergo a translation and/or a rotation. As size and pin-count have increased in recent years, surface-mount components, such as ball-grid arrays (BGAs) and/or connectors, have increased in mass and, therefore, have become more prone to separate from, or to become misaligned with, the double-sided printed circuit board when inverted and reflowed. To retain these larger surface-mount components, adhesives presently are applied to the double-sided printed circuit board before the surface-mount components are positioned. Automatic adhesive application, however, requires additional equipment, which must be purchased and maintained; whereas, manual application of the adhesive results in unpredictable quality and increased labor expenses.

In view of the foregoing, it is believed that a need exists for an inexpensive apparatus to retain inverted components on double-sided printed circuit board assemblies during subsequent reflow stages that overcomes the aforementioned obstacles, limitations, and deficiencies in the manufacture of double-sided printed circuit board assemblies.

DETAILED DESCRIPTION OF THE PREFERRED EMBODIMENTS

Figures 1, 2:
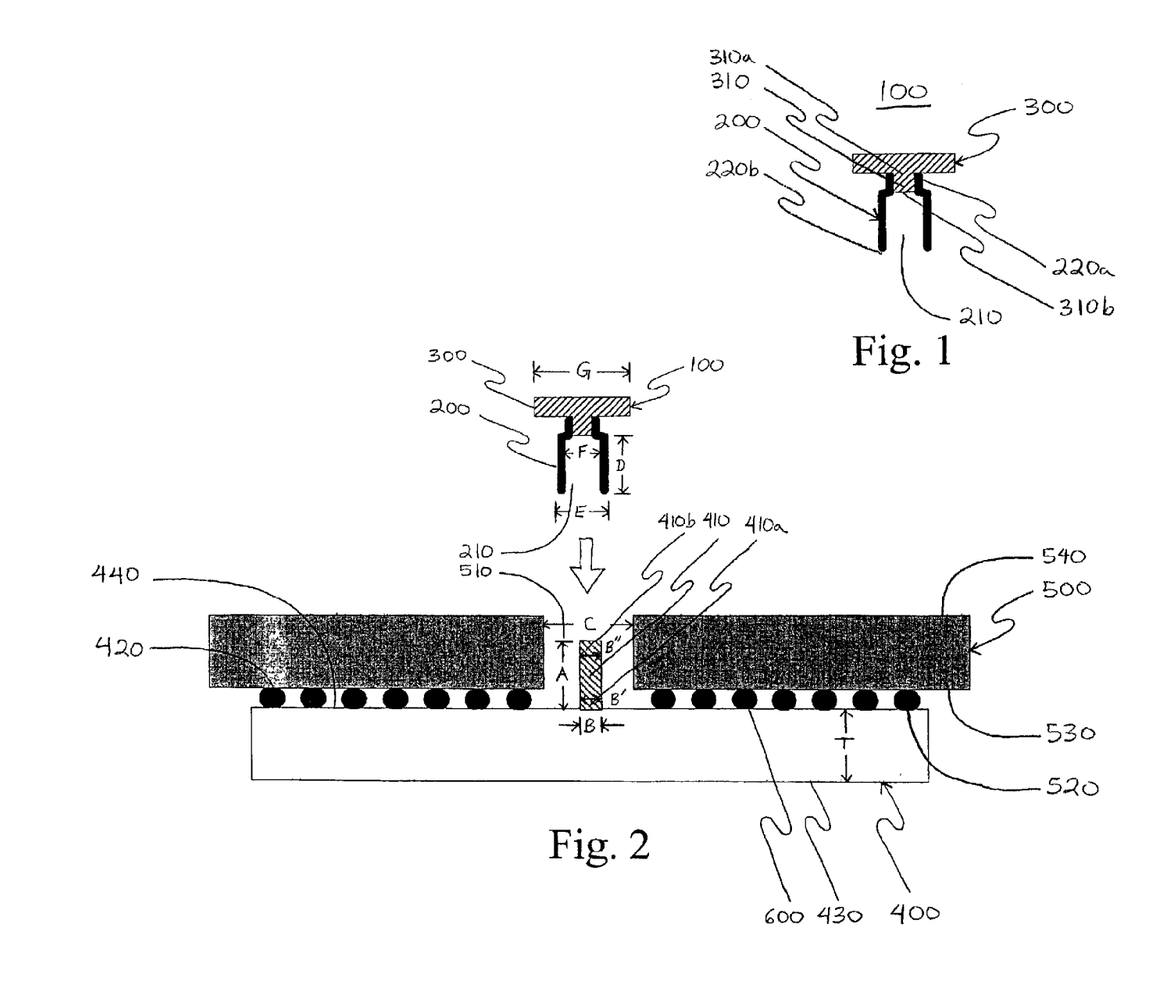
FIG. 1 is an illustration of one preferred embodiment of a heat-shrinkable retainer for double-sided printed circuit board assemblies in accordance with the present invention.
FIG. 2 illustrates the heat-shrinkable retainer of FIG. 1 after a double-sided printed circuit board with a previously-assembled component has been inverted.

Since assembled surface-mount components can separate from, or become misaligned with, a double-sided printed circuit board when subsequently inverted and reflowed under present manufacturing techniques, an inexpensive apparatus to retain the assembled surface-mount components during subsequent reflow stages can prove much more desirable and provide a basis for a wide range of printed circuit board assembly applications, such as personal computer products. This result can be achieved, according to one embodiment of the present invention, by employing a retainer 100 for double-sided printed circuit board assemblies as shown in FIG. 1. The retainer 100 includes a heat-shrinkable member 200 and a retaining member 300.

The retainer 100 is configured to retain a component 400 assembled onto one side of a double-sided printed circuit board 500 as shown in FIG. 2. The component 400 comprises any type of electrical and/or electronic component, such as an integrated circuit, a socket, or a connector. Although the component 400 preferably is a surface-mount component manufactured in, for example, a ball-grid array (BGA), a quad flat pack (QFP), or a thin small outline package (TSOP), it will be appreciated that the retainer 100 is compatible with components 400 manufactured in any type of package, including through-hole packages. The component 400 includes one or more electrical connections 420, such as leads and/or pads, which are electrically isolated and/or supported by a component package 430. The component package 430 can be formed from any type of electronic packaging material, such as plastic, ceramic, or metal, that is well-known in the art. Being configured to couple the component 400 with one or more relevant mounting surfaces 520, such as solder pads or lands, on the double-sided printed circuit board 500, each of the electrical connections 420 is coupled with the one or more relevant mounting surfaces 520 via a solder connection 600.

The component 400 further includes a coupling member, more specifically a post 410. The post 410 is coupled with, and extends from, the component package 430 of the component 400. The post 410 preferably is substantially centrally positioned such that a mass and/or a size of the component 400 is substantially equally distributed about the post 410. The post 410 can comprise any type of extension and can be formed in any shape or size. For example, the post 410 can have a length A and a width B. The length A of the post 410 can comprise any length, and the width B of the post 410 can be any width. Preferably, the length A of the post 410 is substantially equal to 1.3 mm, and the width B of the post 410 is substantially uniform and approximately equal to 1.5 mm. Although the post 410 can be formed into any regular or irregular shape, the post 410 preferably is formed as a substantially uniform right cylindrical peg. The post 410 also has a proximal end region 410a and a distal end region 410b and is coupled with the component package 430 via the proximal end region 410a. A size and/or width B' of the proximal end region 410a of the post 410 can be larger than, substantially equal to, or smaller than a size and/or width B" of the distal end region 410b. The post 410 can be formed from any type of material, such as plastic, ceramic, or metal, that is well-known in the art. Like the electronic packaging material of the component package 430, the material forming the post 410 is configured to remain chemically and/or functionally stable when exposed to temperatures that are much higher than a a melting point of solder or a typical solder reflow temperature range used in SMT manufacturing. The solder reflow temperature range generally is substantially between 180° C. and 240° C.

The post 410 can be coupled with the component package 430 at any time and preferably is formed onto the component package 430 when the component 400 is being produced. Stated somewhat differently, the component package 430 and the post 410 preferably comprise a single unit. The post 410 can be coupled with the component package 430 before the component 400 has been assembled onto the double-sided printed circuit board 500, for example, during a separate manufacturing stage and/or during pre-assembly preparation of the component 400. If desirable, the post 410 can be coupled with the component package 430 after the component 400 has been assembled onto the double-sided printed circuit board 500. The post 410 can be coupled with the component package 430 in any manner known in the art, including via an adhesive, at least one clamp, and/or at least one fastener. The post 410 can extend from any portion of the component package 430 and preferably is configured to extend from a surface 440 of the component package 430 that is substantially adjacent to the double-sided printed circuit board 500.

The component 400 is assembled onto the one or more relevant mounting surfaces 520 on one side, such as a primary side 530 or a secondary side 540, of the double-sided printed circuit board 500 in any manner known in the relevant art, including wave soldering, hand soldering, convection reflow, and/or infrared (IR) reflow. The primary side 530 is a side of the double-sided printed circuit board that is first populated and reflowed; whereas, the secondary side 540 is opposite the primary side 530, being populated and reflowed after the primary side 530. For example, the component 400 can be assembled onto the primary side 530 by applying solder paste (not shown) to each of the relevant mounting surfaces 520. The component 400 then can be positioned onto the relevant mounting surfaces 520, and the double-sided printed circuit board 500 can be heated to the typical solder reflow temperature. Upon approaching the typical solder reflow temperature, the solder paste begins to liquefy and a surface tension of the liquefied solder paste enables the component 400 to substantially align with, and to couple with, the relevant mounting surfaces 520. Once the component 400 is substantially aligned with the relevant mounting surfaces 520 on the primary side 530, the liquefied solder paste forms the solder connections 600, coupling each of the electrical connections 420 with the one or more relevant mounting surfaces 520. Additional components (not shown) can be assembled onto the primary side 530 of the double-sided printed circuit board 500 along with the component 400. For purposes of illustration, the component 400 is shown and described as being assembled onto the primary side 530; however, it will be appreciated that the component 400 can be assembled on either side of the double-sided printed circuit board 500, including the secondary side 540. After the component 400 is assembled onto the primary side 530, the double-sided printed circuit board 500 is inverted, as shown in FIG. 2, to facilitate the positioning of other components (not shown) onto the secondary side 540.

The retainer 100, preferably along with other components (not shown), is configured to be positioned onto the secondary side 540 after the double-sided printed circuit board 500 has been inverted. The heat-shrinkable member 200 of the retainer 100 is formed from unshrunken heat-shrinkable material (not shown) and can be formed into any size or shape, such as a tube. The heat-shrinkable material can comprise any type of heat-shrinkable material and is configured to activate, or shrink, at an activation temperature that is less than or substantially equal to a typical solder reflow temperature. Comprising a stable polymer material, the heat-shrinkable material preferably is configured to resist chemical decomposition when exposed to temperatures that are much higher than the typical solder reflow temperature. For example, Compound D5-I, produced by Program Technology Ltd. in The Netherlands, is capable of withstanding decomposition at temperatures as high as 400° C., which is much higher than typical solder reflow temperatures that range substantially between 180° C. and 240° C. The heat-shrinkable material also has a shrinkage percentage (not shown), comprising a percentage of change between a size and/or volume of the heat-shrinkable material after being activated relative to a size and/or volume of the heat-shrinkable material prior to being activated. The shrinkage percentage of the heat-shrinkable material preferably is at least fifty percent.

The heat-shrinkable member 200 is configured to form a channel 210. The channel 210 in the heat-shrinkable member 200 is configured to receive the distal end region 310b of the post 310, substantially in whole or in part. The channel 210 in the heat-shrinkable member 200 can be formed in the heat-shrinkable material at any time. For example, the channel 210 can be preformed in the heat-shrinkable material, such as in a heat-shrinkable member 200 that is shaped as a tube or a toroid, or can be formed in the heat-shrinkable material by the distal end region 310b as the distal end region 310b is being received. Preferably, the channel 210 has an unshrunken size and/or width F. The unshrunken size and/or width F of the channel 210 can comprise any size and/or width greater than the size and/or width B" of the distal end region 410b and/or less than the unshrunken width E of the heat-shrinkable member 200. Preferably, the unshrunken size and/or width F is substantially uniform and approximately equal to 1.7 mm, being configured to provide a band of at least 0.15 mm of the heat-shrinkable material surrounding, in whole or in part, the distal end region 310b. Stated somewhat differently, the channel 210 of heat-shrinkable material is configured to substantially fully or partially surround the size and/or width B" of the distal end region 410b and/or the width B of the post 310.

An opening 510 is formed in the double-sided printed circuit board 500 and is configured to receive the heat-shrinkable member 200 and/or the distal end region 410b of the post 410. The opening 510 can comprise any type of opening, such as a via and/or a plated or non-plated through-hole, and extends through the double-sided printed circuit board 500. The opening 510 can be formed with any size that is greater than a width E of the heat-shrinkable member 200 and/or the width B of the distal end region 410b, preferably exceeding the width E of the heat-shrinkable member 200 and/or the width B" of the distal end region 410b by approximately 0.020". For example, the opening 510 can comprise a non-plated through hole with a diameter C that is approximately equal to 2.0 mm. When the component 400 is assembled onto the one or more relevant mounting surfaces 520 on the primary side 530, the post 410 is substantially axially aligned with the opening 510. The post 410 is configured to extend substantially toward the opening 510. The length A of the post 410 can comprise any length such that the distal end region 410b may, as shown in FIG. 2, or may not be configured to be received within the opening 510. If received within the opening 510, the distal end region 410b is capable of extending partially or substantially entirely through the opening 510. Stated somewhat differently, the length A of the post 410 can be greater than, substantially equal to, or less than a thickness T of the double-sided printed circuit board 500. The thickness T of the double-sided printed circuit board 500 can be any thickness and preferably comprises a standard printed circuit board thickness, such as 0.062", 0.050", 0.040", or 0.012".

The heat-shrinkable member 200 further is configured to receive, substantially in whole or in part, the distal end region 410b and/or the post 410 extending from the component 400 via the opening 510. To receive the distal end region 410b, for example, the heat-shrinkable member 200 and/or the channel 210 is substantially axially aligned with the opening 510 and/or the distal end region 410b. The heat-shrinkable member 200 can be formed in any shape or size. For example, the heat-shrinkable member 200 can have an unshrunken length D and an unshrunken width E. Preferably being less than the thickness T of the double-sided printed circuit board 500, the unshrunken length D of the heat-shrinkable member 200 can comprise any length. The unshrunken width E of the heat-shrinkable member 200 can have any width greater than the size and/or width B" of the distal end region 410b and/or less than the diameter C of the opening 510. Preferably, the unshrunken length D of the heat-shrinkable member 200 is substantially equal to 1.3 mm, and the unshrunken width E of the heat-shrinkable member 200 is approximately equal to 2.0 mm.

Figure 3:
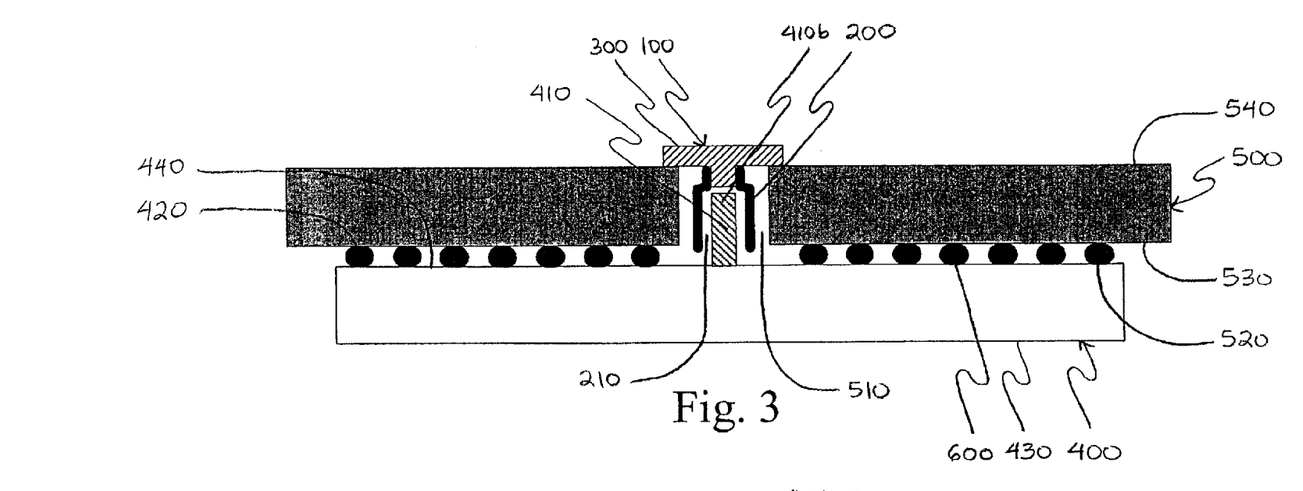
FIG. 3 illustrates the heat-shrinkable retainer of FIG. 2 after the heat-shrinkable retainer receives a post extending from the previously-assembled component via an opening in the double-sided printed circuit board.

Like the post 410, the heat-shrinkable member 200 may, as shown in FIG. 3, or may not be configured to be received within the opening 510. If received within the opening 510, the heat-shrinkable member 200 is capable of extending partially or substantially entirely through the opening 510. For example, if the heat-shrinkable member 200 is not configured to be received within the opening 510, the distal end region 410b extends through the opening 510, and the diameter C of the opening 510 is greater than the size and/or width B" of the distal end region 410b. The heat-shrinkable member 200 therefore is configured to receive the distal end region 410b substantially adjacent to the secondary side 540 of the double-sided printed circuit board 500. Alternatively, if the distal end region 410b is not configured to be received within the opening 510, the heat-shrinkable member 200 extends through the opening 510, and the diameter C of the opening 510 is greater than the unshrunken width E of the heat-shrinkable member 200. In such a case, the heat-shrinkable member 200 is configured to receive the distal end region 410b substantially adjacent to the primary side 530 of the double-sided printed circuit board 500. Lastly, the heat-shrinkable member 200 and the distal end region 410b both can be configured to be received within the opening 510. In this illustration, the diameter C of the opening 510 is greater than the unshrunken width E of the heat-shrinkable member 200, which is greater than the size and/or width B" of the distal end region 410b. The heat-shrinkable member 200 therefore is configured to receive the distal end region 410b substantially within the opening 510 formed in the double-sided printed circuit board 500.

The retaining member 300 for the retainer 100 is coupled with, and/or formed on, the heat-shrinkable member 200 and can be formed into any shape or size. For example, the retaining member 300 can be formed in the shape of a cylinder with a diameter G. Although the diameter G of the retaining member 300 can be of any size, the diameter G is greater than the diameter C of the opening 510 formed in the double-sided printed circuit board 500. Preferably, the diameter G of the retaining member 300 is substantially equal to 5.0 mm. The retaining member 300 can be formed from a heat-resistant material (not shown). The heat-resistant material can comprise any type of material, such as plastic, ceramic, or metal, that is configured to remain dimensionally and/or functionally stable when exposed to temperatures that are much higher than the typical solder reflow temperature. The plastic preferably comprises a liquid crystal polymer (LCP) plastic. Teflon, available from Jensen Inert Products in Coral Springs, Fla., and Ultem/Polyether-imide, produced by Parkway Products, Inc., in Florence, Ky., for example, each are examples of a suitable heat-resistant material.

The retaining member 300 can be coupled with the heat-shrinkable member 200 in any manner known in the relevant art. Returning to FIG. 1, for example, the retaining member 300 includes an extension 310, such as a nipple or a nub, to couple the retaining member 300 with the heat-shrinkable member 200. Comprising a heat-resistant material (not shown), the extension 310 can be formed in any shape or size and can be coupled with the retaining member 300 in any manner known in the art. The extension 310 has a proximal end region 310a and a distal end region 310b, each having a cross-section (not shown). The extension 310 is coupled with the retaining member via the proximal end region 310a, and the distal end region 310b extends from the retaining member 300. Although configured to be formed with any dimension, the cross-section of the distal end region 310b preferably is larger than the cross-section of the proximal end region 310a to facilitate coupling with the heat-shrinkable member 200. As was previously discussed in more detail above, the heat-resistant material of the extension 310 can comprise any type of material, such as plastic, ceramic, or metal, and is configured to remain dimensionally and/or functionally stable when exposed to temperatures that are much higher than the typical solder reflow temperature. The heat-resistant material of the extension 310 can be substantially the same as, or different from, the heat-resistant material comprising the retaining member 300. Preferably, the extension 310 is formed on the retaining member 300 such that the extension 310 and the retaining member 300 comprise a single unit.

When formed, for example, in the shape of a tube, as shown in FIG. 1, the heat-shrinkable member 200 can be coupled with the extension 310 and/or the retaining member 300 via a proximal end region 220a of the heat-shrinkable member 200. The proximal end region 220a can be configured to receive and/or engage the extension 310 and/or the retaining member 300 in any manner known in the art, such as by shrinkably engaging the extension 310 and/or the retaining member 300. To shrinkably engaging the extension 310 and/or the retaining member 300, the heat-shrinkable material forming the proximal end region 220a is pre-activated by being exposed to a temperature that is greater than or substantially equal to the activation temperature of the heat-shrinkable material. When the heat-shrinkable material forming the proximal end region 220a is pre-activated, the heat-shrinkable material comprising the distal end region 220b is not activated and is configured to receive the distal end region 410b and/or the post 410 from the component 400. The proximal end region 220a alternatively, or additionally, can be configured to receive and/or engage the extension 310 and/or the retaining member 300 via an adhesive, at least one clamp, and/or at least one fastener, such as a screw. The adhesive can comprise any type of adhesive known in the art. Each clamp can comprise any type of clamp, such as a C-clamp washer and/or band formed from a metal and/or a polymer, and the heat-shrinkable material is disposed substantially between at least one clamp and the extension 310 and/or the retaining member 300. Further, upon receiving the extension 310 and/or the retaining member 300, the proximal end region 220a can be exposed to a temperature that is greater than or substantially equal to the activation temperature of the heat-shrinkable material to shrink the proximal end region 220a and to shrinkably engage the extension 310 and/or the retaining member 300. When the heat-shrinkable member 200 is coupled with the extension 310 and/or the retaining member 300, a distal end region 220b of the heat-shrinkable member 200 is not activated and is configured to receive the distal end region 410b and/or the post 410 from the component 400.

The retaining member 300 can be formed on the heat-shrinkable member 200. The retaining member 300 can be formed from, for example, a heat-shrinkable material (not shown) as was previously discussed in more detail above and can be formed in any manner known in the art. The heat-shrinkable material of the retaining member 300 can be substantially the same as, or different from, the heat-shrinkable material comprising the heat-shrinkable member 200. For example, the retaining member 300 can comprise an amount of unshrunken heat-shrinkable material with a size that, upon being activated, is greater than the diameter C of the opening 510 formed in the double-sided printed circuit board 500. The heat-shrinkable material forming the retaining member 300 alternatively, or additionally, can be pre-activated by being exposed to a temperature that is greater than or substantially equal to the activation temperature of the heat-shrinkable material. When the heat-shrinkable material comprising the retaining member 300 is pre-activated, the heat-shrinkable material comprising the distal end region 220b of the heat-shrinkable member 200 is not activated and is configured to receive the distal end region 410b and/or the post 410 from the component 400. If formed as a length of heat-shrinkable tubing, for example, the heat-shrinkable material of the retaining member 300 can be cut lengthwise into two or more strips (not shown), and the two or more strips can be folded radially outwardly to form the retaining member 300. Each of the strips can be unshrunken or pre-activated. Alternatively, or additionally, the retainer 100 can comprise a body of unshrunken heat-shrinkable material that is configured to receive the distal end region 410b of the post 410 and that has a diameter, after being activated, that is substantially equal to, or greater than, the diameter G of the opening 510.

Returning to FIG. 3, one or more other components (not shown) each can be positioned onto one or more relevant mounting surfaces (not shown) on the secondary side 540 by any manner known in the art, such as a pick-and-place machine (not shown), as was previously discussed in more detail above. The retainer 100 likewise is configured to be positioned onto the secondary side 540 by any manner known in the art. The retainer 100 preferably is positioned onto the secondary side 540 in the same manner, such as via a pick-and-place machine (not shown), that is used to position the other components. For example, when formed in the shape of a tube, as shown in FIG. 1, the heat-shrinkable member 200 can be positioned onto the post 410 such that the channel 210 receives the distal end region 410b. The retaining member 300 then can be positioned onto the heat-shrinkable member 200 such that the extension 310 is received by the channel 210. The heat-shrinkable member thereby can be configured to shrinkably engage the distal end region 410*b* and the extension 310 when the heat-shrinkable material activates during a subsequent solder reflow stage. When properly positioned, the channel 210 and/or the heat-shrinkable member 200 of the retainer 100 is substantially in axial alignment with the opening 510 and/or the distal end region 410*b* of the post 410 and receives the distal end region 410*b*. The channel 210 and/or the heat-shrinkable member 200 is configured to continue to receive the distal end region 410*b* until the retaining member 300 of the retainer 100 becomes substantially adjacent to, and/or comes into contact with, the secondary side 540 as shown in FIG. 3.

The retaining member 300 can be formed as a solid body, as shown in FIG. 1, or as a permeable body, such as a toroid, defining one or more apertures (not shown). The apertures each can be formed substantially completely and/or partially through the retaining member 300. One or more of the apertures can be substantially in axial alignment with the channel 210 and/or the heat-shrinkable member 200. Each substantially axially aligned aperture is configured to receive the distal end region 410*b* of the post 410 via the channel 210 and/or the heat-shrinkable member 200. For example, when the length A of the post 410 is greater than the thickness T of the double-sided printed circuit board 500, the distal end region 410*b* passes through the channel 210 and/or the heat-shrinkable member 200 and is received by one or more of the substantially axially aligned apertures. The heat-shrinkable member 200 can be disposed, partially or substantially entirely, within one of the substantially axially aligned apertures and can be coupled with the retaining member 300 in any manner known in the art, as was previously discussed in more detail above. If the retaining member 300 comprises a toroid with an aperture, for example, the retainer 100 can comprise the toroid with the heat-shrinkable being centrally disposed within the aperture to receive the distal end region 410*b*.

Once positioned, the retainer 100 is held in place via gravity and/or the distal end region 410*b* while the other components are positioned and/or assembled onto the secondary side 540 by any manner known in the art, such as convection reflow, as was previously discussed in more detail above. During convection reflow, the double-sided printed circuit board 500, along with the component 400, the retainer 100, and the other components, begins to heat. For example, an ambient temperature surrounding the double-sided printed circuit board 500 increases from room temperature and approaches the typical solder reflow temperature at which some or all of the solder connections 600 of the component 400 and the solder connections of the other components begin to liquefy. Being formed from the heat-shrinkable material with an activation temperature that is less than or substantially equal to the typical solder reflow temperature, the channel 210 and/or the heat-shrinkable member 200, is configured to shrink as the ambient temperature approaches the typical solder reflow temperature.

The channel 210 and/or the heat-shrinkable member 200 further is configured to shrinkably engage the distal end region 410*b* of the post 410 before or as some or all of the solder connections 600 of the component 400 and/or the solder connections of the other components begin to liquefy. As the heat-shrinkable material shrinks, the retaining member 300 is configured to be cinched against the secondary side 540. The retaining member 300, having the diameter G exceeding the diameter C of the opening 510 formed in the double-sided printed circuit board 500, remains substantially adjacent to, and/or in contact with, the opening 510 without being received within the opening 510. By shrinkably engaging the distal end region 410*b* and/or cinching the retaining member 300 against the secondary side 540, the retainer 100 is configured to substantially maintain the proper position of the component 400 as some or all of the solder connections 600 liquefy during convection reflow. While supporting the mass of the component 400, the heat-shrinkable member preferably is sufficiently laterally flexible to permit the surface tension of the liquefied solder connections 600 to guide the substantially horizontal alignment of the component 400 with the relevant mounting surfaces 520. Stated somewhat differently, the retainer 100 preferably does not produce a substantial sheer stress on the solder connections 600.

The heat-shrinkable member 200 and the retaining member 300, each being formed from materials that can withstand decomposition and/or remain functionally stable at temperatures that are greater than the typical solder reflow temperature, remain functionally stable during convection reflow and prevent the retainer 100 from deforming due to heat exposure. The component 400 thereby is substantially inhibited from separating from the double-sided printed circuit board 500 and/or from becoming substantially misaligned, such as via a translation and/or a rotation, with the relevant mounting surfaces 520. Thus, when the solder connections 600 cool and again solidify after convection reflow, the component 400 remains properly assembled on the double-sided printed circuit board 500. As desired, the retainer 100 can be configured to be removed from, and/or remain engaged with, the distal end region 410*b* after convection reflow.

Figure 5:
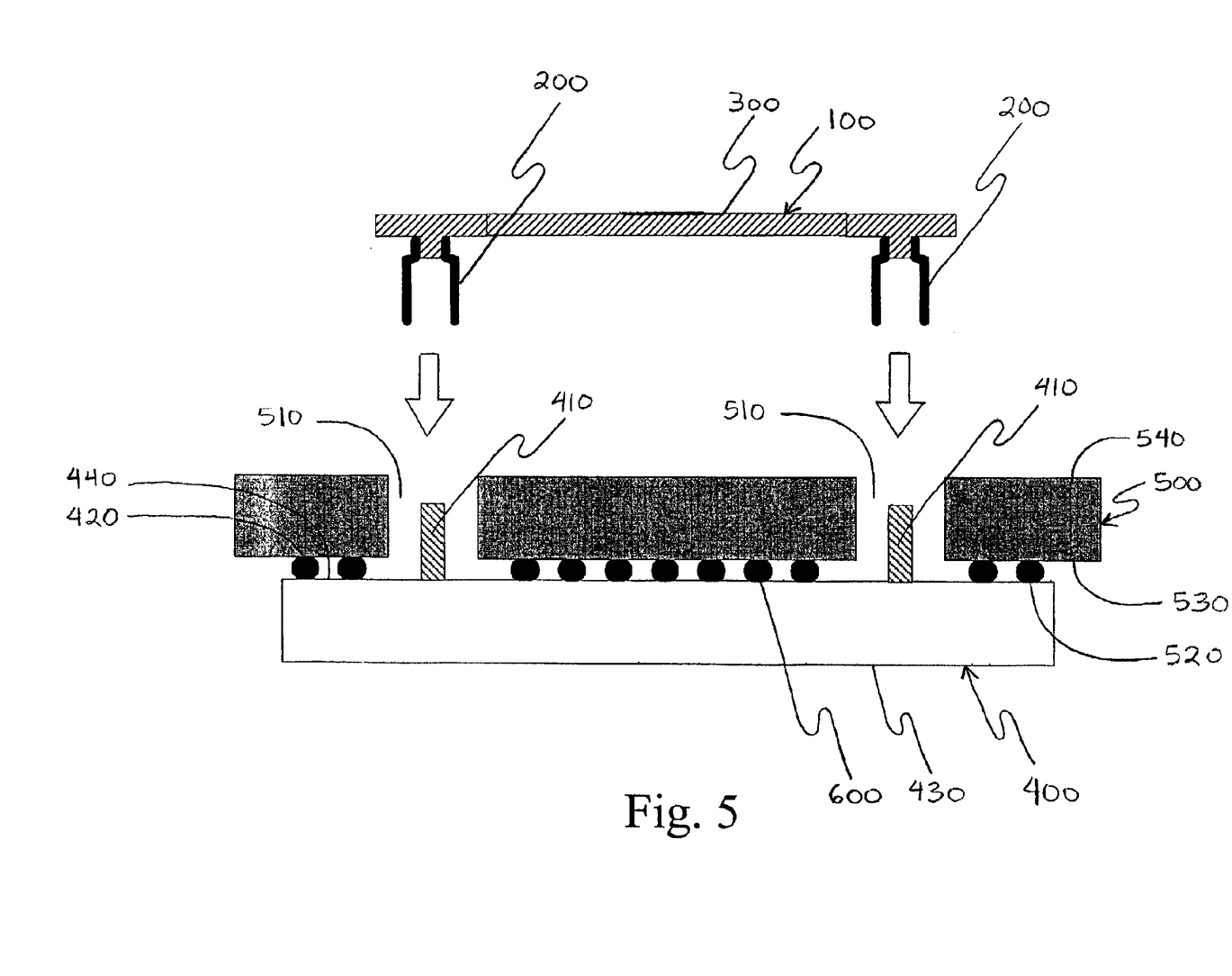
FIG. 5 is an illustration of another preferred embodiment of a heat-shrinkable retainer for double-sided printed circuit board assemblies in accordance with the present invention.

Those skilled in the art will appreciate that the retainer 100 of the present invention can be configured for use with a component 400 having a plurality of posts 410. For example, the plurality of posts 410 may be used to adequately support larger and/or heavier components 400. The plurality of posts 410 are coupled with, and extend from, a component package 430 of the component 400 and preferably are non-centrally located on the component package 430. Although each of the plurality of posts 410 can be received and shrinkably engaged by the retainer 100 described in more detail above, the retainer 100 can include one or more retaining members 300 each being coupled with a plurality of heat-shrinkable members 200 as shown in FIG. 5. Each of the retaining members 300 is formed from a heat-resistant material, and each of the plurality of heat-shrinkable members 200 is formed from a heat-shrinkable material. The plurality of heat-shrinkable members 200 each can be configured to receive one or more posts 410 extending from one or more components 400 assembled on a double-sided printed circuit board 500 and can be formed from substantially the same heat-shrinkable material and/or a different heat-shrinkable material. The plurality of heat-shrinkable members 200 are configured to receive the posts 410 each via an opening 510 formed in the double-sided printed circuit board 500 such that the double-sided printed circuit board 500 is disposed substantially between the retaining members 300 and the components 400. The double-sided printed circuit board 500 can include one or more openings 510, and each of the openings 510 can be associated with one or more heat-shrinkable members 200 and/or one or more posts 410. Upon being exposed to a temperature that is less than or substantially equal to a typical solder reflow temperature, at least one of the plurality of heat-shrinkable members 200 each is configured to activate and/or to shrinkably engage the post 410 extending from one or more of the components 400. Since one or more other components (not shown) may be positioned substantially adjacent to one of the retaining members 300, the retaining members 300 each may be suitably shaped to inhibit substantial interference with these other components.

If the component 400 is too large and/or heavy to be sufficiently supported by a single post 410, a plurality of posts 410 may extend from the component 400. The plurality of posts 410 may be arranged in any manner and preferably includes distal end regions 410*b* that are substantially equally distributed such that the mass of the component 400 is substantially equally distributed among the plurality of posts 410. For example, if the component 400 is manufactured in a component package 430 that is substantially rectangular, a coupling member, more specifically a post 410, can extend from each corner of the component package 430. Two or more components 400 can be retained by the retainer 100 if the plurality of heat-shrinkable members 200 is configured to receive at least one post 410 from each of the two or more components 400.

In operation, a component 400 is assembled onto one side, such as a primary side 530 as shown in FIG. 2, of a double-sided printed circuit board 500. The component 400 can comprise any type of electrical and/or electronic component and includes one or more electrical connections 420 that are electrically isolated and/or supported by a component package 430. Each of the electrical connections 420 of the component 400 is coupled with one or more relevant mounting surfaces 520 on the double-sided printed circuit board 500 via a solder connection 600. As was previously discussed in more detail above, each solder connection 600 can be formed in any manner known in the relevant art, including wave soldering, hand soldering, convection reflow, and/or infrared (IR) reflow. Additional components (not shown) can be assembled onto the primary side 530 of the double-sided printed circuit board 500 along with the component 400. For purposes of illustration, the component 400 is shown and described as being assembled onto the primary side 530; however, it will be appreciated that the component 400 can be assembled on either side of the double-sided printed circuit board 500, including a secondary side 540. After the component 400 is assembled onto the primary side 530, the double-sided printed circuit board 500 is inverted, as shown in FIG. 2, to facilitate the positioning of other components (not shown) onto the secondary side 540.

As was previously discussed in more detail above, the component 400 further includes a coupling member, more specifically a post 410, that can be formed from any type of material, such as plastic, ceramic, or metal, that is well-known in the art. Having a proximal end region 410*a* and a distal end region 410*b*, the post 410 is coupled with the component package 430 via the proximal end region 410*a*. The post 410 can be coupled with the component package 430 before or after the component 400 is assembled onto the double-sided printed circuit board 500. The post 410 can be coupled with the component package 430 in any manner known in the art, including via an adhesive, at least one clamp, and/or at least one fastener. The post 410 can extend from any portion of the component package 430 and preferably extends from a surface 440 of the component package 430 that is substantially adjacent to the double-sided printed circuit board 500. The component 400 is assembled onto the primary side 530 of the double-sided printed circuit board 500 such that the post 410 is substantially axially aligned with, and extends substantially toward, an opening 510 formed in the double-sided printed circuit board 500.

After the double-sided printed circuit board 500 is inverted, as shown in FIG. 3, a retainer 100, preferably with one or more other components (not shown), is positioned on the secondary side 540 by any manner known in the art, such as a pick-and-place machine (not shown), as was previously discussed in more detail above. The one or more other components each are positioned onto one or more relevant mounting surfaces (not shown) on the secondary side 540. The retainer 100 includes a heat-shrinkable member 200 and a retaining member 300. The heat-shrinkable member 200 is coupled with the retaining member 300, and a channel 210 can be formed in the heat-shrinkable member 200 to receive the distal end region 410*b* of the post 410, substantially in whole or in part. The retainer 100 is positioned on the secondary side 540 such that the double-sided printed circuit board 500 is substantially disposed between the retaining member 300 and the component 400. The channel 210 and/or the heat-shrinkable member 200 preferably is substantially axially aligned with the distal end region 410*b* and/or the opening 510 formed in the double-sided printed circuit board 500. The opening 500 receives, in whole or in part, the heat-shrinkable member 200 and/or the distal end region 410*b* of the post 410. The distal end region 410*b* is received by the channel 210 and/or the heat-shrinkable member 200 via the opening 510. The channel 210 and/or the heat-shrinkable member 200 continues to receive the distal end region 410*b* until the retaining member 300, which is coupled with the heat-shrinkable member 200, is positioned substantially adjacent to, and/or comes into contact with, the secondary side 540 as shown in FIG. 3.

Figure 4:
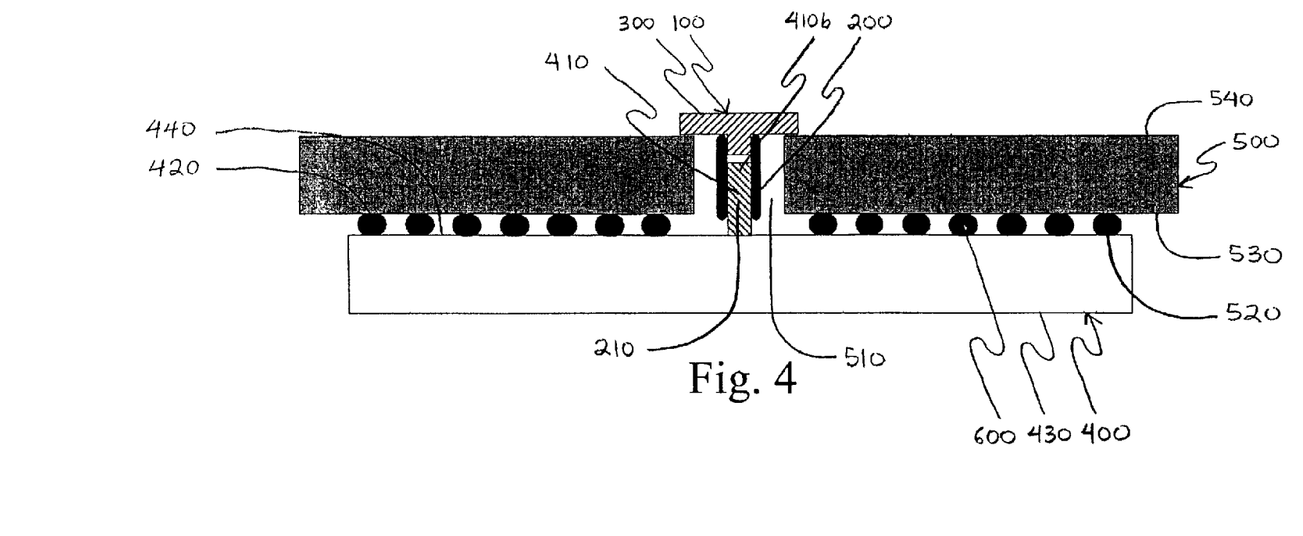
FIG. 4 illustrates the heat-shrinkable retainer of FIG. 3 after the heat-shrinkable retainer shrinkably engages the post from the previously-assembled component after a reflow stage.

After the retainer 100 and/or the other components have been positioned on the secondary side 540, the other components are assembled onto the double-sided printed circuit board 500 by any manner known in the art, such as convection reflow, as was previously discussed in more detail above. During convection reflow, an ambient temperature surrounding the double-sided printed circuit board 500, the component 400, the retainer 100, and/or the other components begins to increase. Being formed from a heat-shrinkable material (not shown) with an activation temperature that is less than or substantially equal to a typical solder reflow temperature, the channel 210 and/or the heat-shrinkable member 200, activates or shrinks as the ambient temperature approaches a typical solder reflow temperature as shown in FIG. 4. The channel 210 and/or the heat-shrinkable member 200, as shrunken, shrinkably engages the distal end region 410*b* and/or cinches the retaining member 300 against the secondary side 540.

As the ambient temperature reaches or exceeds the typical solder reflow temperature during convection reflow, some or all of the solder connections 600 of the component 400 and/or the solder connections of the other components begin to liquefy. While being exposed to the ambient temperature in excess of the typical solder reflow temperature, the channel 210 and/or the heat-shrinkable member 200 resist chemical decomposition, and the retaining member 300, being formed from a heat-resistant material, remains functionally stable. Although the component 400 is inverted during convection reflow, the retainer 100 substantially maintains the position of the component 400 and substantially inhibits the component 400 from separating from, or becoming substantially misaligned relative to, the relevant mounting surfaces 520. After convection reflow, the solder connections 600 of the component 400, and the solder connections of the other components, each cool and solidify. The other components thereby are assembled to the secondary side 540 of the double-sided printed circuit board 500, and the component 400 remains properly assembled on the primary side 530 of the double-sided printed circuit board

500. After the solder connections 600 of the component 400 have solidified, the retainer 100 can remain shrinkably engaged with, or can be removed from, the distal end region 410*b*, as desired.

Figure 6:
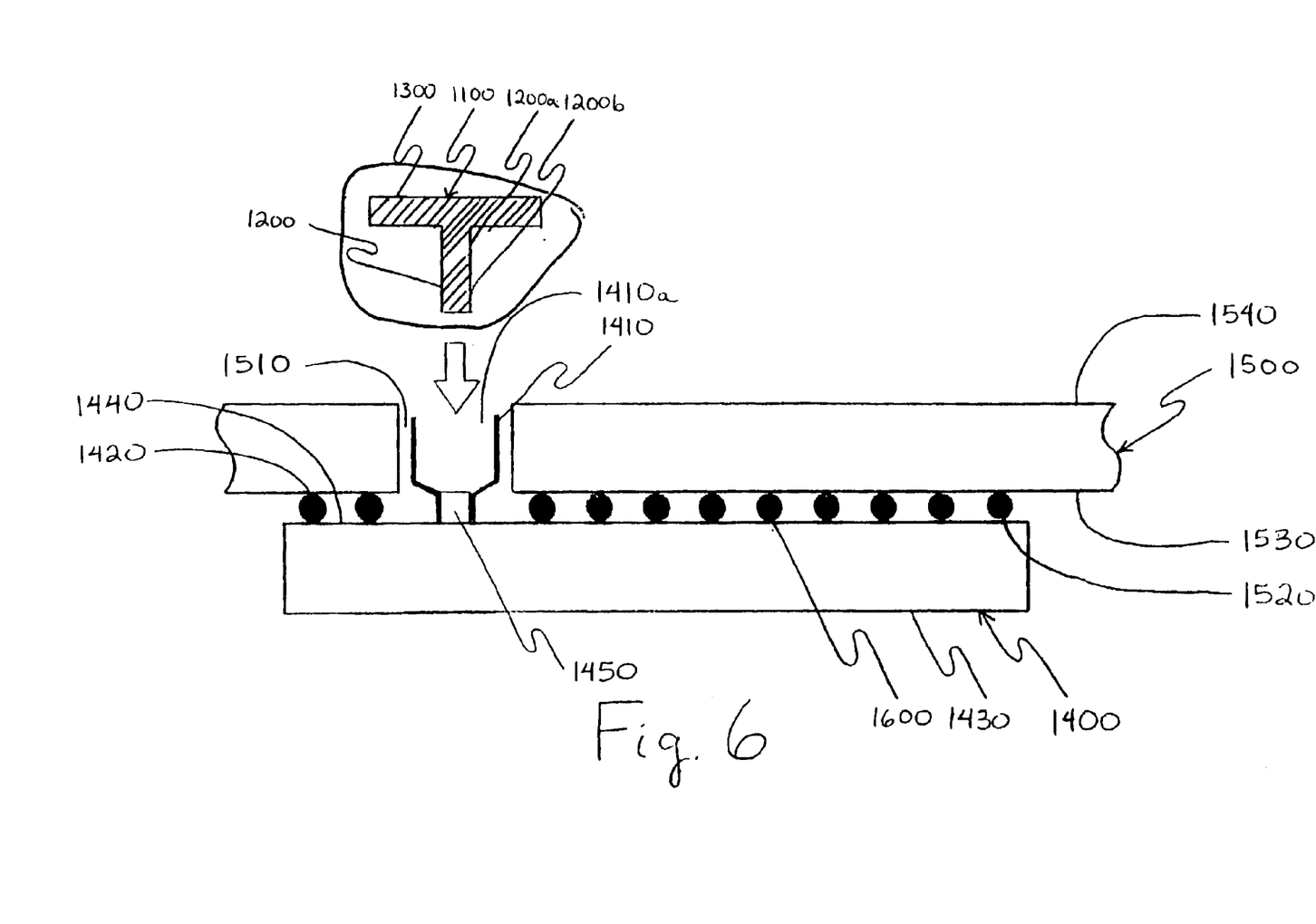
FIG. 6 is an illustration of another preferred embodiment of a heat-shrinkable retainer for double-sided printed circuit board assemblies in accordance with the present invention.

A second embodiment of the retainer 1100 is illustrated in FIG. 6. In this embodiment, the retainer 1100 comprises a retaining member 1300 and a coupling member, more specifically a post 1200. As was previously discussed in more detail above, the retaining member 1300 can be formed into any size or shape. Being coupled with the retaining member 1300 in any manner known in the art, as was previously discussed in more detail above, the post 1200 extends from the retaining member 1300 and can be formed in any shape or size. The post 1200 can comprise any type of extension and includes a proximal end region 1200*a* and a distal end region 1200*b*. Preferably being formed onto the retaining member 1300 when the retainer 1100 is being produced, the post 1200 can be coupled with, and/or formed onto, the retaining member 1300 via, for example, the proximal end region 1200*a* at any time. Stated somewhat differently, the post 1200 and the retaining member 1300 preferably comprise a single unit. As was previously discussed in more detail above, the post 1200 and/or the retaining member 1300 can be formed from any type of material (not shown). The material forming the post 1200 and/or the retaining member 1300 is a heat-resistant material (not shown) and is configured to remain chemically and/or functionally stable when exposed to temperatures that are much higher than the typical solder reflow temperature.

As was previously discussed in more detail above, the component 1400 can comprise any type of electrical and/or electronic component. The component 1400 includes one or more electrical connections 1420, which are electrically isolated and/or supported by a component package 1430. The component package 1430 can be formed from any type of electronic packaging material that is well-known in the art. Being configured to couple the component 1400 with one or more relevant mounting surfaces 1520 on the double-sided printed circuit board 1500, each of the electrical connections 1420 can be coupled with the one or more relevant mounting surfaces 1520 via a solder connection 1600. The component 1400 is assembled onto the one or more relevant mounting surfaces 1520 on one side, such as a primary side 1530, of the double-sided printed circuit board 1500 in any manner known in the relevant art, as was previously discussed in more detail above. After the component 1400 is assembled onto the primary side 1530, the double-sided printed circuit board 1500 is inverted, as shown in FIG. 6, to facilitate the positioning of other components (not shown) onto a secondary side 1540 of the double-sided printed circuit board 1500.

The component 1400 further includes a heat-shrinkable member 1410, which is configured to receive the post 1200 via, for example, a channel 1410*a*. The heat-shrinkable member 1410 is formed from unshrunken heat-shrinkable material (not shown). The heat-shrinkable material can comprise any type of heat-shrinkable material, as was previously discussed in more detail above, and is configured to activate, or shrink, at an activation temperature that is less than or substantially equal to a typical solder reflow temperature. Comprising a stable polymer material, the heat-shrinkable material preferably is configured to resist chemical decomposition when exposed to temperatures that are much higher than the typical solder reflow temperature. The heat-shrinkable member 1410 preferably is substantially centrally positioned such that a mass and/or a size of the component 1400 is substantially equally distributed about the heat-shrinkable member 1410. The heat-shrinkable member 1410 can be formed into any shape or size, such as a tube, and/or can be coupled with, and/or formed on, the component package 1430 in any manner known in the art as was previously discussed in more detail above. For example, the heat-shrinkable member 1410 can be coupled with an extension 1450 formed on the component 1400 via an adhesive, at least one clamp, and/or at least one fastener. It will be appreciated that the heat-shrinkable member 1410 can be coupled with the component 1400 at any time, including during a separate manufacturing stage and/or during pre-assembly preparation of the component 1400. To prevent inadvertent activation, however, the heat-shrinkable member 1410 preferably is coupled with the component package 1430 after the component 1400 has been assembled onto the double-sided printed circuit board 1500.

As was previously discussed in more detail above, an opening 1510 is formed in the double-sided printed circuit board 1500 and is configured to receive the heat-shrinkable member 1410 and/or the distal end region 1200*b* of the post 1200. The opening 1510 can comprise any type of opening and/or extends through the double-sided printed circuit board 1500 as was previously discussed in more detail above. When the component 1400 is assembled onto the one or more relevant mounting surfaces 1520 on the primary side 1530, the heat-shrinkable member 1410 and/or the channel 1410*a* is substantially axially aligned with the opening 1510. The heat-shrinkable member 1410 is configured to extend substantially toward the opening 1510 and may, as shown in FIG. 6, or may not be configured to be received, in whole or in part, within the opening 1510. The heat-shrinkable member 1410 and/or the channel 1410*a* is configured to receive the distal end region 1200*b* of the post 1200 extending from the retaining member 1300 via the opening 1510. To receive the distal end region 1200*b*, for example, the heat-shrinkable member 1410 and/or the channel 1410*a* is substantially axially aligned with the opening 1510 and/or the distal end region 1200*b* such that the double-sided printed circuit board 1500 is substantially disposed between the retaining member 1300 and the component 1400. As was previously discussed in more detail above, the post 1200 and/or the distal end region 1200*b* may, as shown in FIG. 6, or may not be configured to be received, in whole or in part, within the opening 1510.

The retainer 1100 and one or more other components (not shown) each can be positioned onto the secondary side 1540 by any manner known in the art, such as a pick-and-place machine (not shown), as was previously discussed in more detail above. When properly positioned, the heat-shrinkable member 1410 and/or the channel 1410*a* is configured to be in substantial axial alignment with the opening 1510 and/or the distal end region 1200*b* of the post 1200 and to receive the distal end region 1200*b*. The heat-shrinkable member 1410 and/or the channel 1410*a* is configured to continue to receive the distal end region 1200*b* until the retaining member 1300 of the retainer 1100 becomes substantially adjacent to, and/or comes into contact with, the secondary side 1540. As was previously discussed in more detail above, the channel 1410*a* can be formed in the heat-shrinkable material at any time and can be configured to fully or partially surround the distal end region 1200*b* and/or the post 1200.

Once positioned, the retainer 1100 is configured to be held in place via gravity, the heat-shrinkable member 1410, and/or the channel 1410*a* while the other components are positioned and/or assembled onto the secondary side 1540 by any manner known in the art, such as convection reflow, as was previously discussed in more detail above. During convection reflow, the double-sided printed circuit board 1500, along with the component 1400, the retainer 1100, and the other components, begins to heat. For example, an ambient temperature surrounding the double-sided printed circuit board 1500 increases from room temperature and approaches the typical solder reflow temperature at which some or all of the solder connections 1600 of the component 1400 and/or the solder connections of the other components begin to liquefy. Being formed from the heat-shrinkable material with an activation temperature that is less than or substantially equal to the typical solder reflow temperature, the heat-shrinkable member 1410 and/or the channel 1410*a* is configured to activate and/or shrink as the ambient temperature nears the typical solder reflow temperature.

The heat-shrinkable member 1410 and/or the channel 1410*a* is further configured to shrinkably engage the distal end region 1200*b* of the post 1200 before or as some or all of the solder connections 1600 of the component 1400 and/or the solder connections of the other components begin to liquefy as was previously discussed in more detail above. As the heat-shrinkable material shrinks, the retaining member 1300 is configured to be cinched against the secondary side 1540. By shrinkably engaging the distal end region 1200*b* and/or cinching the retaining member 1300 against the secondary side 1540, the retainer 1100 is configured to substantially maintain the proper position of the component 1400 as the solder connections 1600 liquefy during convection reflow. The heat-shrinkable member 1410 and the retainer 1100, each being formed from materials that can withstand decomposition and/or remain functionally stable at temperatures that are greater than the typical solder reflow temperature, remain functionally stable during convection reflow. The component 1400 thereby is substantially inhibited from separating from the double-sided printed circuit board 1500 and/or from becoming substantially misaligned, such as via a translation and/or a rotation, with the relevant mounting surfaces 1520. Thus, when the solder connections 1600 cool and again solidify after convection reflow, the component 1400 remains properly assembled on the double-sided printed circuit board 1500. As desired, the retainer 1100 can be configured to be removed from, and/or remain engaged with, the distal end region 1200*b* after convection reflow.

Those skilled in the art will appreciate that the retainer 1100 of the present invention can be configured to include one or more retaining members 1300 each being coupled with a plurality of posts 1200. The retaining members 1300 and/or the posts 1200 each is formed from a heat-resistant material. Each of the posts 1200 extends from the retaining members 1300 and is configured to be received by one or more of a plurality of heat-shrinkable members 1410. The plurality of heat-shrinkable members 1410 each is formed from a heat-shrinkable material and is coupled with one or more components 1400 assembled on a double-sided printed circuit board 1500. Each of the plurality of heat-shrinkable members 1410 can be formed from substantially the same heat-shrinkable material and/or a different heat-shrinkable material. The plurality of heat-shrinkable members 1410 each is configured to receive one or more of the posts 1200 such that the double-sided printed circuit board 1500 is disposed substantially between the retaining members 1300 and the one or more components 1400. The double-sided printed circuit board 1500 can include one or more openings 1510, and each of the openings 1510 can be associated with one or more heat-shrinkable members 1410 and/or one or more posts 1200. Upon being exposed to a temperature that is less than or substantially equal to a typical solder reflow temperature, at least one of the plurality of heat-shrinkable members 1410 is configured to activate and/or to shrinkably engage one or more of the posts 1200 extending from the retaining members 1300.

If the component 1400 is large and/or heavy, a plurality of heat-shrinkable members 1410 can extend from the component 1400. The plurality of heat-shrinkable members 1410 may be arranged in any manner and preferably is distributed such that the mass of the component 1400 is substantially equally distributed among the plurality of heat-shrinkable members 1410. For example, if the component 1400 is manufactured in a component package 1430 that is substantially rectangular, one of the plurality of heat-shrinkable members 1410 can extend from each corner of the component package 1430. Two or more components 1400 can be retained by the retainer 1100 if one or more of the plurality of posts 1200 is configured to be received by at least one of heat-shrinkable member 1410 from each of the two or more components 1400.

In operation, a component 1400 is assembled onto one side, such as a primary side 1530 as shown in FIG. 6, of a double-sided printed circuit board 1500 as was previously discussed in more detail above. The component 1400 can comprise any type of electrical and/or electronic component and includes one or more electrical connections 1420 that are electrically isolated and/or supported by a component package 1430. Each of the electrical connections 1420 of the component 1400 is coupled with one or more relevant mounting surfaces 1520 on the double-sided printed circuit board 1500 via a solder connection 1600. As was previously discussed in more detail above, each solder connection 1600 can be formed in any manner known in the relevant art. Additional components (not shown) can be assembled onto the primary side 1530 of the double-sided printed circuit board 1500 with the component 1400. After the component 1400 is assembled onto the primary side 1530, the double-sided printed circuit board 1500 is inverted, as shown in FIG. 6, to facilitate the positioning of other components (not shown) onto the secondary side 1540.

As was previously discussed in more detail above, the component 1400 includes a heat-shrinkable member 1410 that can be formed from any type of unshrunken heat-shrinkable material, that is well-known in the art. The heat-shrinkable member 1410 can be coupled with the component package 1430 of the component 1400 in any manner known in the art and preferably is formed to include a channel 1410*a*. Although the heat-shrinkable member 1410 can be coupled with the component package 1430 at any time, the heat-shrinkable member 1410 preferably is coupled with the component package 1430 after the component 1400 is assembled onto the double-sided printed circuit board 1500. The heat-shrinkable member 1410 also can be coupled with the component package 1430 in any manner known in the art, including via an adhesive, at least one clamp, and/or at least one fastener, as was previously discussed in more detail above. The heat-shrinkable member 1410 can extend from any portion of the component package 1430 and preferably extends from a surface 1440 of the component package 1430 that is substantially adjacent to the double-sided printed circuit board 1500. The component 1400 is assembled onto the primary side 1530 such that the heat-shrinkable member 1410 is substantially axially aligned with, and extends substantially toward, an opening 1510 formed in the double-sided printed circuit board 1500.

After the double-sided printed circuit board 1500 has been inverted, as shown in FIG. 6, a retainer 1100, preferably with one or more other components (not shown), is positioned on the secondary side 1540 of the double-sided printed circuit board 1500 by any manner known in the art, such as a pick-and-place machine (not shown), as was previously discussed in more detail above. The one or more other components each are positioned onto one or more relevant mounting surfaces (not shown) on the secondary side 1540. The retainer 1100 includes a coupling member, more specifically a post 1200, and a retaining member 1300. As was previously discussed in more detail above, the retaining member 1300 is coupled with a proximal end region 1200*a* of the post 1200, and a distal end region 1200*b* of the post 1200 extends from the retaining member 1300. The retainer 1100 is positioned on the secondary side 1540 such that the double-sided printed circuit board 1500 is substantially disposed between the retaining member 1300 and the component 1400. The channel 1410*a* and/or the heat-shrinkable member 1410 preferably is substantially axially aligned with the distal end region 1200*b* and/or the opening 1510 formed in the double-sided printed circuit board 1500. The opening 1500 comprises any type of opening and receives, in whole or in part, the heat-shrinkable member 1410 and/or the distal end region 1200*b*. The distal end region 1200*b* of the post 1200 is received by the channel 1410*a* and/or the heat-shrinkable member 1410 via the opening 1510. The channel 1410*a* and/or the heat-shrinkable member 1410 continues to receive the distal end region 1200*b* until the retaining member 1300 is positioned substantially adjacent to, and/or comes into contact with, the secondary side 1540.

After the retainer 1100 and/or the other components have been positioned on the secondary side 1540, the other components are assembled onto the double-sided printed circuit board 1500 by any manner known in the art, such as convection reflow, as was previously discussed in more detail above. During convection reflow, an ambient temperature surrounding the double-sided printed circuit board 1500, the component 1400, the retainer 1100, and/or the other components begins to increase. Being formed from a heat-shrinkable material (not shown) with an activation temperature that is less than or substantially equal to a typical solder reflow temperature, the channel 1410*a* and/or the heat-shrinkable member 1410 activates or shrinks as the ambient temperature approaches a typical solder reflow temperature. The channel 1410*a* and/or the heat-shrinkable member 1410, as shrunken, shrinkably engages the distal end region 1200*b* of the post 1200 and/or cinches the retaining member 1300 against the secondary side 1540.

As the ambient temperature reaches or exceeds the typical solder reflow temperature during convection reflow, some or all of the solder connections 1600 of the component 1400 and/or the solder connections of the other components begin to liquefy. While being exposed to the ambient temperature greater than the typical solder reflow temperature, the channel 1410*a* and/or the heat-shrinkable member 1410 resist chemical decomposition, and the retaining member 1300, being formed from a heat-resistant material, remains functionally stable. Although the component 1400 is inverted during convection reflow, the retainer 1100 substantially maintains the position of the component 1400 and substantially inhibits the component 1400 from separating from, or becoming substantially misaligned relative to, the relevant mounting surfaces 1520. After convection reflow, the solder connections 1600 of the component 1400, and the solder connections of the other components, each cool and solidify. The other components thereby are assembled to the secondary side 1540 of the double-sided printed circuit board 1500, and the component 1400 remains properly assembled on the primary side 1530 of the double-sided printed circuit board 1500. After the solder connections 1600 of the component 1400 have solidified, the retainer 1100 can remain shrinkably engaged with, or can be removed from, the component 1400, as desired.

While the invention is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A retainer for printed circuit board assemblies, comprising:
   a heat-shrinkable member disposed within the printed circuit board assemblies, said heat-shrinkable member being configured to receive a coupling member extending from a component; and
   a retaining member, said retaining member being coupled with said heat-shrinkable member.

2. The retainer of claim 1, wherein said component is assembled on a printed circuit board.

3. The retainer of claim 2, wherein said printed circuit board forms an opening, said heat-shrinkable member being configured to receive said coupling member via said opening.

4. The retainer of claim 3, wherein said coupling member is configured to be received within said opening.

5. The retainer of claim 3, wherein said heat-shrinkable member is configured to be received within said opening.

6. The retainer of claim 2, wherein said coupling member is coupled with said component before said component is assembled on said printed circuit board.

7. A retainer for printed circuit board assemblies, comprising:
   a heat-shrinkable member, said heat-shrinkable member being configured to receive a coupling member extending from a component; and
   a retaining member, said retaining member being coupled with said heat-shrinkable member, wherein said component is assembled on a printed circuit board, and wherein said component is assembled on one side of said printed circuit board, and said retaining member is substantially adjacent to an opposite side of said printed circuit board.

8. A retainer for printed circuit board assemblies, comprising:
   a heat-shrinkable member, said heat-shrinkable member being configured to receive a coupling member extending from a component; and
   a retaining member, said retaining member being coupled with said heat-shrinkable member, wherein said component is assembled on a printed circuit board, and wherein said printed circuit board is disposed substantially between said retaining member and said component.

9. The retainer of claim 2, wherein said heat-shrinkable member is sufficiently laterally flexible to permit a surface tension of liquefied solder to substantially guide a substantially horizontal alignment of said component during assembly.

10. The retainer of claim 1, wherein said heat-shrinkable member is configured to activate at a temperature that is less than or substantially equal to a typical solder reflow temperature.

11. A retainer for printed circuit board assemblies, comprising:

a heat-shrinkable member, said heat-shrinkable member being configured to receive a coupling member extending from a component; and a retaining member, said retaining member being coupled with said heat-shrinkable member, wherein said heat-shrinkable member is configured to resist decomposition at a temperature that is greater than a typical solder reflow temperature.

12. The retainer of claim 1, wherein said heat-shrinkable member includes a channel to receive said coupling member.

13. The retainer of claim 12, wherein said heat-shrinkable member comprises heat-shrinkable tubing.

14. The retainer of claim 1, wherein said heat-shrinkable member is configured to shrinkably engage said coupling member when exposed to a temperature that is less than or substantially equal to a typical solder reflow temperature.

15. The retainer of claim 1, wherein said retaining member is formed from a heat-resistant material.

16. A retainer for printed circuit board assemblies, comprising:

a heat-shrinkable member, said heat-shrinkable member being configured to receive a coupling member extending from a component; and a retaining member, said retaining member being coupled with said heat-shrinkable member, wherein said retaining member is formed from a heat-resistant material, and wherein said heat-resistant material is configured to remain functionally stable at a temperature that is greater than or substantially equal to a typical solder reflow temperature.

17. The retainer of claim 1, wherein said retaining member includes an extension, said retaining member being coupled with said heat-shrinkable member via said extension.

18. A retainer for printed circuit board assemblies, comprising:

a heat-shrinkable member, said heat-shrinkable member being configured to receive a coupling member extending from a component; and a retaining member, said retaining member being coupled with said heat-shrinkable member, wherein said retaining member forms an aperture, said heat-shrinkable member being disposed substantially within said aperture.

19. A retainer for printed circuit board assemblies, comprising:

at least one heat-shrinkable member disposed within the printed circuit board assemblies, said at least one heat-shrinkable member each being configured to receive a coupling member extending from a component assembled on a printed circuit board via an opening formed in said printed circuit board; and a retaining member, said retaining member being coupled with each of said plurality of heat-shrinkable members.

20. The retainer of claim 19, wherein a second coupling member extends from said component, and at least one of said at least one heat-shrinkable member is configured to receive said second coupling member via a second opening formed in said printed circuit board.

21. The retainer of claim 19, wherein a second component is assembled on said printed circuit board, and at least one of said at least one heat-shrinkable member is configured to receive a coupling member extending from said second component via a second opening formed in said printed circuit board.

22. The retainer of claim 19, wherein at least one of said at least one heat-shrinkable member is configured to shrinkably engage at least one of said at least one coupling member when exposed to a temperature that is less than or substantially equal to a typical solder reflow temperature.

23. A retainer for printed circuit board assemblies, comprising:

a retaining member, said retaining member having at least one coupling member, said at least one coupling member each extending from said retaining member; and a heat-shrinkable member, said heat-shrinkable member being coupled with a component assembled on a printed circuit board and being configured to receive at least one of said at least one coupling member within an opening formed in said printed circuit board.

24. The retainer of claim 23, wherein a second heat-shrinkable member is coupled with said component, said second heat-shrinkable member being configured to receive at least one of said at least one coupling member via a second opening formed in said printed circuit board.

25. The retainer of claim 23, wherein a second component is assembled on said printed circuit board and is coupled with a heat-shrinkable member, said heat-shrinkable member of said second component being configured to receive at least one of said at least one coupling member via a second opening formed in said printed circuit board.

26. The retainer of claim 23, wherein said heat-shrinkable member is configured to shrinkably engage at least one of said at least one coupling member when exposed to a temperature that is less than or substantially equal to a typical solder reflow temperature.

* * * * *